(12) United States Patent
Derderian et al.

(10) Patent No.: US 10,431,519 B1
(45) Date of Patent: Oct. 1, 2019

(54) CARRIER REMOVAL BY USE OF MULTILAYER FOIL

(71) Applicant: Micron Technology, Inc., Boise, ID (US)

(72) Inventors: James M. Derderian, Boise, ID (US); Andrew M. Bayless, Boise, ID (US); Xiao Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/969,978

(22) Filed: May 3, 2018

(51) Int. Cl.
*H01L 23/00* (2006.01)
*H01L 23/367* (2006.01)
*H01L 23/532* (2006.01)
*H01L 23/498* (2006.01)
*B32B 43/00* (2006.01)
*B32B 7/12* (2006.01)

(52) U.S. Cl.
CPC .... *H01L 23/3672* (2013.01); *H01L 23/49827* (2013.01); *H01L 23/53223* (2013.01); *B32B 7/12* (2013.01); *B32B 43/006* (2013.01); *H01L 2221/68318* (2013.01); *H01L 2221/68327* (2013.01); *H01L 2221/68381* (2013.01)

(58) Field of Classification Search
CPC ............. H01L 21/6835; H01L 21/6836; H01L 2221/68381; H01L 2221/68318; H01L 2221/68327; B32B 43/006; B32B 7/12
See application file for complete search history.

(56) References Cited

U.S. PATENT DOCUMENTS

| | | | |
|---|---|---|---|
| 2010/0155936 A1* | 6/2010 | Codding | H01L 21/6835 257/734 |
| 2014/0147986 A1* | 5/2014 | Dang | H01L 21/02002 438/458 |

* cited by examiner

*Primary Examiner* — Ermias T Woldegeorgis
(74) *Attorney, Agent, or Firm* — Parsons Behle & Latimer

(57) ABSTRACT

A semiconductor device assembly having a semiconductor device attached to a substrate with a foil layer on a surface of the substrate. A layer of adhesive connects the substrate to a first surface of the semiconductor device. The semiconductor device assembly enables processing on the second surface of the semiconductor device. An energy pulse may be applied to the foil layer causing an exothermic reaction to the foil layer that releases the substrate from the semiconductor device. The semiconductor device assembly may include a release layer positioned between the foil layer and the layer of adhesive that connects the substrate to the semiconductor device. The heat generated by the exothermic reaction breaks down the release layer to release the substrate from the semiconductor device. The energy pulse may be an electric charge, a heat pulse, or may be applied from a laser.

17 Claims, 5 Drawing Sheets

CARRIER REMOVAL BY USE OF MULTILAYER FOIL

FIELD

The embodiments described herein relate to semiconductor device assemblies and methods of making a semiconductor device assembly that includes a foil layer than enables the removal of a substrate from a semiconductor device.

BACKGROUND

A substrate, such as a carrier substrate, is often used to support a semiconductor device, such as a semiconductor wafer that includes a plurality of dies, to permit further processing on the semiconductor device. For example, a semiconductor device may include a plurality of structures, such as pads, pillars, vias, or the like, on a first or front side of the device. During the processing of the semiconductor device, the thickness of the semiconductor device may need to be reduced. Various processes, such as, but not limited to, chemical mechanical planarization, grinding, and/or dry etching, may be applied to the back, or second, side of the semiconductor device to remove material from the semiconductor device. For example, the thickness of the semiconductor device may be reduced from a first thickness, such as 775 microns, down to a second thickness, such as 70 microns, using various processes known by one of ordinary skill in the art. Furthermore, various processes, such as, metallization, photolithography patterning and electrical chemical plating, may be applied to the back, or second, side of the semiconductor device to form structures such as pads, pillars, or the like, for the semiconductor device.

Presently, a semiconductor device, such as a semiconductor wafer, may be temporarily bonded to a substrate, such as a carrier wafer, with a temporary adhesive to form a temporary semiconductor device assembly. For example, the first or front side of the semiconductor wafer may be bonded to a carrier wafer with a temporary adhesive that is spin coated onto the carrier wafer. After completing the processing on the second, or back, side of the semiconductor wafer, the semiconductor wafer is removed from the carrier wafer. Typically, the semiconductor wafer is removed, or debonded, from the carrier wafer by thermal/mechanical sliding. In other words, the temporary semiconductor device assembly is heated and force is applied to slide the semiconductor wafer off the carrier wafer. The present process of removing the semiconductor wafer from the carrier wafer may result in, among other things, die cracking and/or pillar smearing. Further, the present process may result in breakage of the semiconductor wafer itself. The edges of the semiconductor wafer may break, crack, or chip during the removal/debonding process.

A temporary adhesive having a relatively low glass transition temperature may be used to bond the carrier to the semiconductor device. The adhesive with the relatively low glass transition temperature is used to better enable that the carrier may be removed from the semiconductor device after the requisite processing. However, the semiconductor carrier and substrate assembly may be subjected to elevated temperatures during the processing potentially causing undesired movement between the carrier and semiconductor device.

A glass carrier may be used to support a semiconductor device during processing. After the requisite processing on the backside of the semiconductor device, a laser may be applied to the adhesive through the glass carrier to release the glass carrier from the semiconductor device. However, glass carriers typically have poor thermal transfer and high mismatch of coefficient and thermal expansion (CTE) which cause wafer warpage issues, and may also sag during processing of the semiconductor device due to the low elastic modulus.

A silicon (Si) carrier substrate having a high thermal conductivity, good rigidity, and a CTE match to a Si semiconductor device may have various advantages compared to a glass carrier used for semiconductor device backside processing. However, a Si carrier typically cannot be removed from the semiconductor device by applying a laser to the adhesive. Instead, a Si carrier may be removed by a thermal/mechanical process, which potentially may damage the semiconductor device, as discussed herein.

Additional drawbacks and disadvantages may exist.

Figure 1:
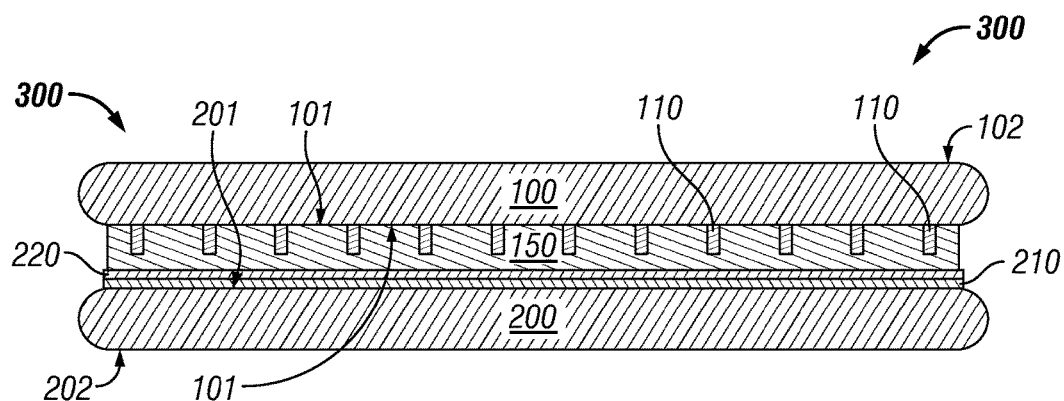
FIG. 1 is a schematic of an embodiment of a semiconductor device assembly.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices and semiconductor device packages may not be shown and/or may not be described in detail to avoid obscuring other aspects of the disclosure. In general, it should be understood that various other devices, systems, and/or methods in addition to those specific embodiments disclosed herein may be within the scope of the present disclosure.

The terms "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, semiconductor device packages, and methods of making and/or operating semiconductor devices.

An embodiment of the disclosure is a semiconductor device assembly comprising a semiconductor device having a first side and a second side and a substrate. A foil layer is attached to a surface of the substrate and a release layer is attached to the foil layer with the foil layer being positioned between the release layer and the surface of the substrate. A layer of adhesive is configured to connect the semiconductor device to the substrate with the layer of adhesive being positioned between the first side of the semiconductor device and the release layer. The application of an energy pulse to the foil layer causes the foil layer to generate heat causing the release layer to selectively release the substrate from the adhesive layer.

An embodiment of the disclosure is a semiconductor device assembly comprising a semiconductor device having a first side and a second side and a substrate with a multilayer foil layer attached to a surface of the substrate. A layer of adhesive connects the semiconductor device to the substrate with the layer of adhesive being located between the first side of the semiconductor device and the multilayer foil layer. The application of an energy pulse to the multilayer foil layer causes an exothermic reaction that releases the substrate form the semiconductor device.

An embodiment of the disclosure is a method of making a semiconductor device assembly. The method comprises depositing a multilayer foil layer on a surface of a substrate and depositing a release layer on the multilayer foil layer, wherein the multilayer foil layer is positioned between the release layer and the surface of the substrate. The method comprises attaching the release layer to a layer of adhesive on a first surface of a semiconductor device to connect the substrate to the semiconductor device. An energy pulse may be applied to the multilayer foil layer to create an exothermic reaction breaking down the release layer and releasing the substrate from the semiconductor device.

Figure 2:
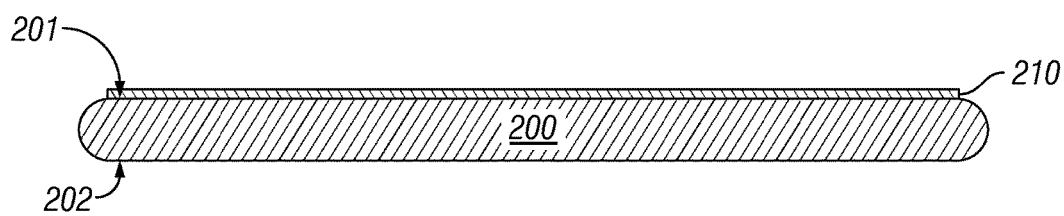
FIG. 2 is a schematic of an embodiment a substrate including a foil layer.
Figure 3:
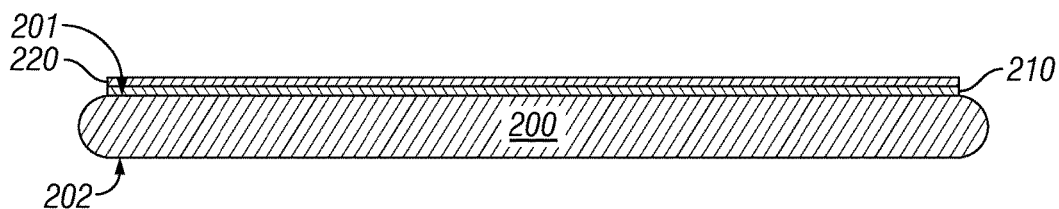
FIG. 3 is a schematic of an embodiment of a substrate including a foil layer and a release layer.
Figure 4:
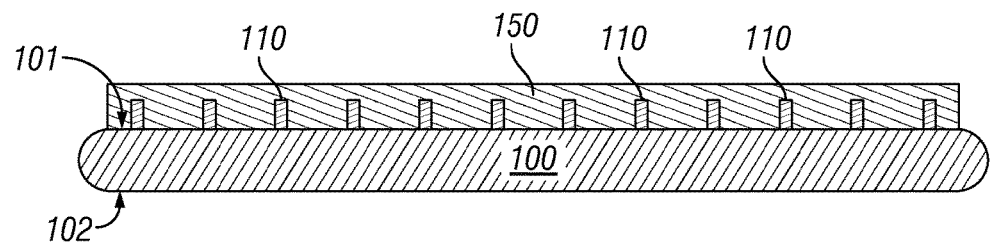
FIG. 4 is a schematic of an embodiment of a semiconductor device having a layer of adhesive on a first surface.

FIG. 1 is a schematic of an embodiment of a semiconductor device assembly 300. The semiconductor device assembly 300 includes a semiconductor device 100 and a substrate 200. FIGS. 2-4 show the semiconductor device 100 and substrate 200 components individually. As shown in FIG. 2, a foil layer 210 is deposited on a first, or top, surface 201 of the substrate 200. The substrate 200 includes a second, or bottom, surface 202 opposite of the first surface 201. The substrate 200 is a carrier that enables processing on the bottom or backside of the semiconductor device 100, as discussed herein. The substrate 200 may be comprised of various materials as would be appreciated by one of ordinary skill in the art having the benefit of this disclosure. For example, the substrate 200 may be, but is not limited to, silicon, ceramic, glass, metal, plastic, a composite material, a laminate material, or the like.

A release layer 220 is deposited onto the foil layer 210, as shown in FIG. 3. The release layer 220 may be comprised of various materials that break down by heat generated by the foil layer 210, as discussed herein. For example, the release layer 220 may be, but is not limited to, silicone, epoxy, polyimide, carbonate, or a combination thereof. The release layer 220 may be comprised of various other materials configured to break down upon application of heat from the foil layer 210 as would be appreciated by one of ordinary skill in the art having the benefit of this disclosure. The release layer 220 may also protect the foil layer 210 from damage during the processing of the second, or bottom, surface 102 of the semiconductor device 100, as discussed herein. The size, shape, location, and/or configuration of the carrier substrate 200, foil layer 210, and the release layer 220 are shown for illustrative purposes and may be varied depending on the application as would be appreciated by one of ordinary skill in the art having the benefit of this disclosure.

The foil layer 210 is preferably a multilayer foil layer deposited onto the substrate 200. As discussed herein, energy may be applied to the foil layer 210 to release the substrate 200 from the semiconductor device 100 when previously connected together to form a semiconductor device assembly 300. An energy pulse may be applied to the foil layer 210 causing an exothermic reaction in the foil layer 210 generating a high amount of heat for a short time period. The foil layer 210 is configured to generate a temperature adequate to break down the release layer 220, but for only a short time period in order to not damage the semiconductor device 100. For example, the exothermic reaction in the foil layer 210 may create a temperature that is approximately 1000 degrees Celsius, or more. However, the foil layer 210 may be configured so that the exothermic reaction lasts for less than one second. For example, the foil layer 210 may be configured so that the exothermic reactions last between approximately 0.1 milliseconds and 1.5 milliseconds.

Figure 10:
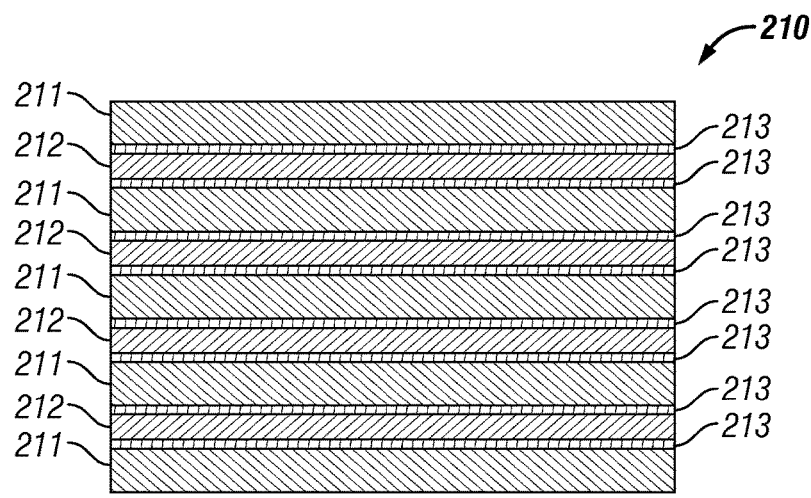
FIG. 10 is a schematic of an embodiment of a multilayer foil layer.

The foil layer 210 is preferably a multilayer foil layer that comprises alternating layers of different metals. FIG. 10 shows an embodiment of a foil layer 210 that includes alternating layers of a first material 211 and a second material 212. The foil layer 210 includes interface layers 213 between the layers of the first material 211 and the layers of the second material 212. The interface layers 213 may include both the first and second materials mixed together. The first and second materials are preferably metals and are configured to create an exothermic reaction upon the application of an energy pulse, which may be a heat pulse, to the foil layer 210. Each layer 211, 212 of the foil layer 210 may comprise one or more materials as would be appreciated by one of ordinary skill in the art having the benefit of this disclosure.

Various materials may be used to comprise the foil layer 210 as would be appreciated by one of ordinary skill in the art having the benefit of this disclosure. For example, the foil layer may include, but is not limited to, alternating layers of nickel and aluminum, zirconium and aluminum, nickel and silicon, molybdenum and silicon, palladium and aluminum, rhodium and aluminum, or combinations thereof. The number, size, location, configuration, and/or shape of the layers 211, 212, 213 of the foil layer 210 are shown for illustrative purposes and may be varied depending on the application as would be appreciated by one of ordinary skill in the art having the benefit of this disclosure. The foil layer 210 may be configured so that the exothermic reaction reaches an approximate specified temperature for an approximate specified time period as would be appreciated by one of ordinary skill in the art.

FIG. 4 is a schematic of a semiconductor device 100 having a first, or top, surface 101 and a second, or bottom, surface 102 opposite the first surface 101. The semiconductor device 100 includes a plurality of structures 110 on the first surface 101. The structures 110 are schematically represented in FIG. 4 and may comprise various structures, such as for example pads, pillars, or the like, as would be appreciated by one of ordinary skill in the art. A layer of adhesive 150 has been deposited onto the first surface 101 of the semiconductor device 100 in order to selectively attach the semiconductor device 100 to the carrier substrate 200 to form a semiconductor device assembly 300, shown in FIG. 1. The semiconductor device 100 may be a semiconductor wafer and the substrate 200 may be a carrier wafer as would be appreciated by one of ordinary skill in the art. The size, shape, location, number, and/or configuration of the layer of adhesive 150, structures 110, and the semiconductor device 100 are shown for illustrative purposes and may be varied depending on the application as would be appreciated by one of ordinary skill in the art having the benefit of this disclosure.

Figure 5:
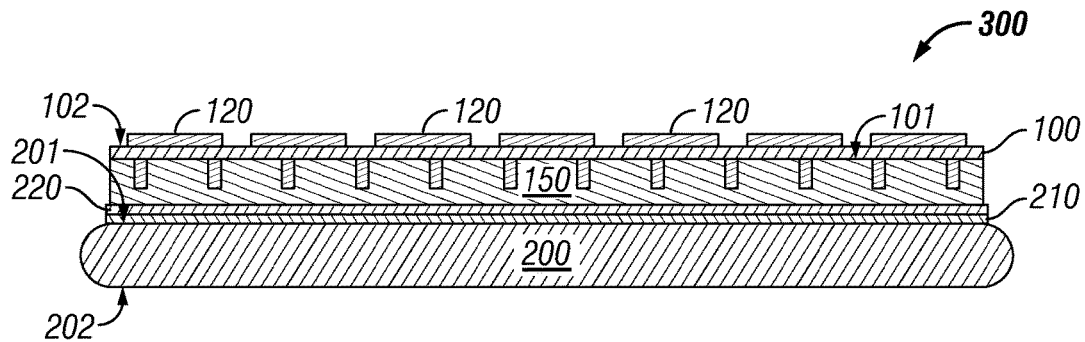
FIG. 5 is a schematic of an embodiment of a semiconductor device assembly with a second surface of a semiconductor device that has been processed.
Figure 6:
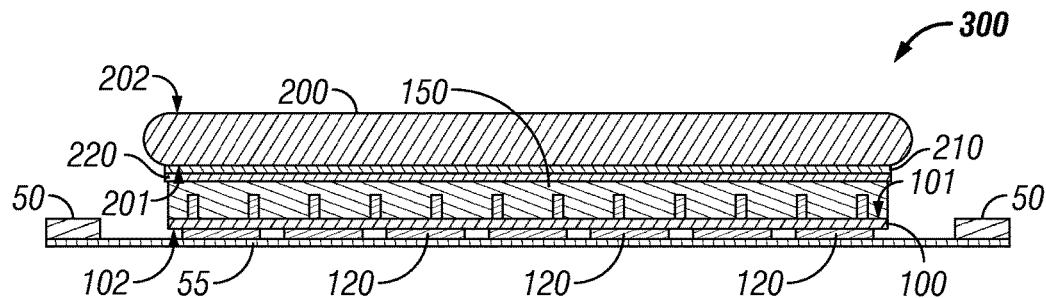
FIG. 6 is a schematic of an embodiment of a semiconductor device assembly being supported on a film frame.

The layer of adhesive 150 on the first side 101 of the semiconductor device 100 enables the first side 101 of the semiconductor device 100 to be selectively attached to the release layer 220 on the substrate 200 to form a semiconductor device assembly 300, shown in FIG. 1. The layer of adhesive 150 may be a thermal plastic adhesive having a relatively high glass transition temperature. The semiconductor device assembly 300 enables processing on the second side 102 of the semiconductor device 100. The processing on the second side 102 of the semiconductor device 100 may include removing material from the semiconductor device 100 and/or forming structures 120 on the second side 102 of the semiconductor device 100, as shown in FIG. 5. The release layer 220 may protect the foil layer 210 from potential damage during the processing of the second side 102 of the semiconductor device 100. For example, the release layer 220 may prevent material from contacting and potentially damaging the foil layer 210.

After completing the processing on the second side 102 of the semiconductor device 100 of the semiconductor device assembly 300, the semiconductor device assembly 300 may be positioned on mounting tape or film 55 connected to a film frame 50 with the second side 102 of the semiconductor device 100 resting on the mounting tape 55. The film frame 50 and mounting tape 55 may be used to support the semiconductor device assembly 300 during the removal of the substrate 200 and the layer of adhesive 150, as discussed herein.

Figure 7:
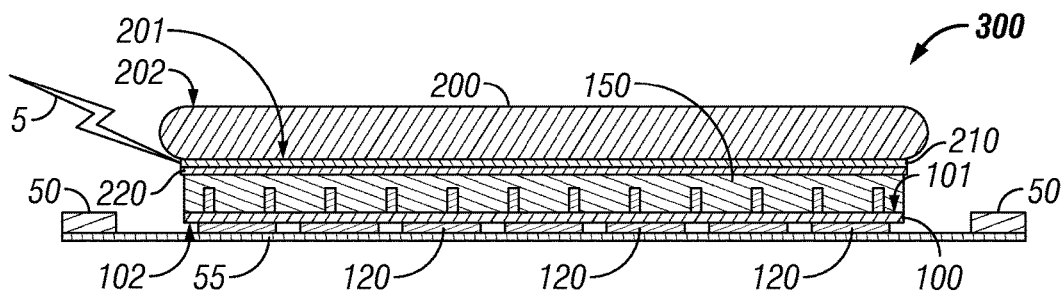
FIG. 7 is a schematic of an energy pulse applied to a foil layer of an embodiment of a semiconductor device assembly.
Figure 8:
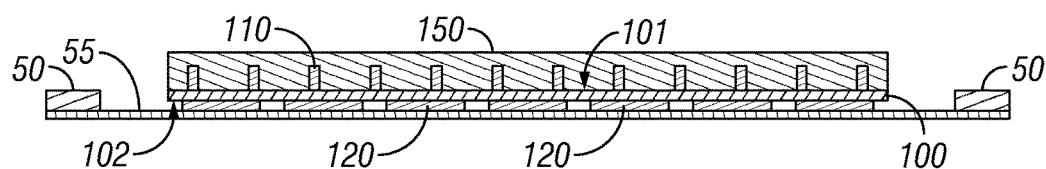
FIG. 8 is a schematic of an embodiment of a semiconductor device separated from a substrate.

An energy pulse 5, such as a heat pulse, is applied to the foil layer 210 of the semiconductor device assembly 300, as shown in FIG. 7. The energy pulse 5 causes an exothermic reaction generating heat adequate to break down, or decompose, the release layer 220 without damaging the semiconductor device 100. The heat generated by the exothermic reaction may be 1000 degrees Celsius, or greater. The heat generated by the exothermic reaction exceeds the decomposition temperature of the release layer 220. The breaking down of the release layer 220 enables the substrate 200 to be removed off the layer of adhesive 150, as shown in FIG. 8. Various mechanisms may be used to cause the exothermic reaction of the foil layer 210 as would be appreciated by one of ordinary skill in the art having the benefit of this disclosure. For example, the energy pulse 5 applied to the foil layer 210 may be, but is not limited to, an electrical charge, a spark, a heat pulse, a laser, or a combination thereof. The exothermic reaction burns up the foil layer 210 as well as breaking down, or decomposing, the release layer 220 enabling the substrate to be removed from the semiconductor device assembly 300 without needing to apply mechanical force to separate the substrate 200 from the layer of adhesive 150.

Figure 9:
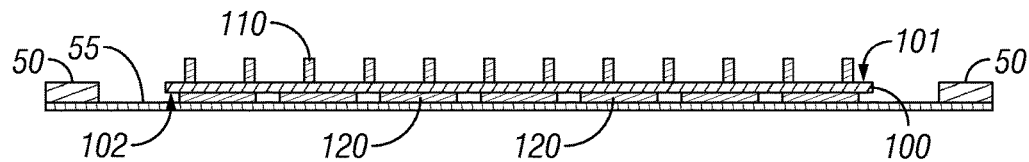
FIG. 9 is a schematic of an embodiment of a semiconductor device with the layer of adhesive removed after the second side has been processed.

After the removal of the substrate 200, the layer of adhesive 150 may be removed from the first surface 101 of the semiconductor device 100, as shown in FIG. 9. Various mechanisms may be used to remove the layer of adhesive 150 from the first surface 101 of the semiconductor device 100 as would be appreciated by one or ordinary skill in the art. For example, the layer of adhesive 150 may be removed using a dry etch, a wet etch, or the like. A solvent may be used to clean the adhesive 150 off the first surface 101 of the semiconductor device 100. FIG. 9 shows the semiconductor device 100 supported on the mounting tape 55 connected to the film frame 50 with the layer of adhesive 150 having been removed.

Figure 11:
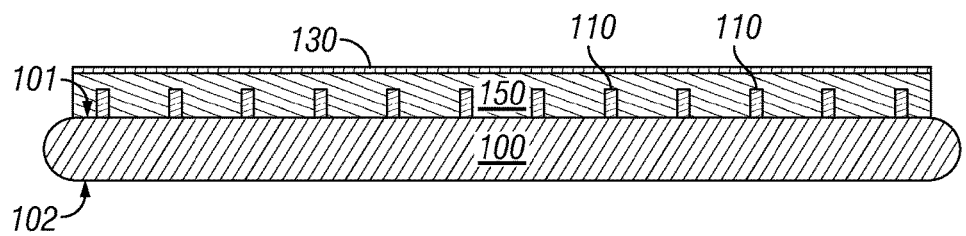
FIG. 11 is a schematic of an embodiment of a semiconductor device having a layer of adhesive on a first surface with a metal layer on the layer of adhesive.
Figure 12:
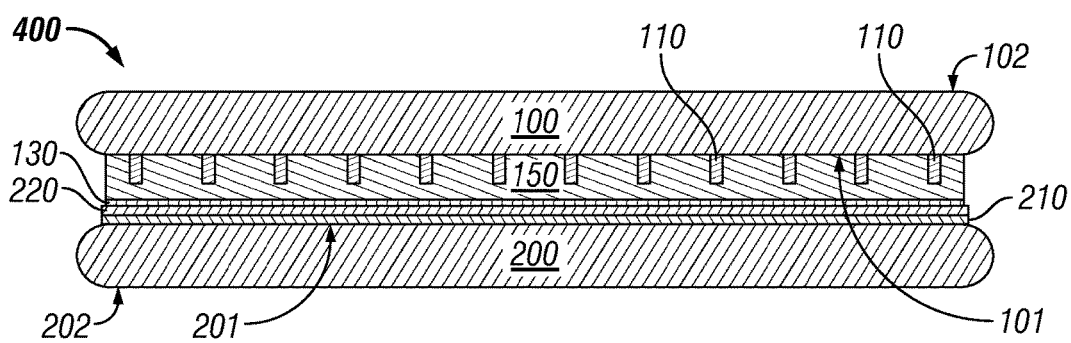
FIG. 12 is a schematic of an embodiment of a semiconductor device assembly.

FIG. 11 shows an embodiment of a semiconductor device 100 that includes a metal layer 130 deposited on the layer of adhesive 150. The metal layer 130 may be used to protect the semiconductor device 100 during the exothermic reaction of the foil layer 210, discussed herein. FIG. 12 shows an embodiment of a semiconductor device assembly 400 having a layer of adhesive 150, a metal layer 130, a release layer 220, and a foil layer 210 positioned between the first surface 101 of the semiconductor device 100 and the first surface 201 of the substrate 200.

Figure 13:
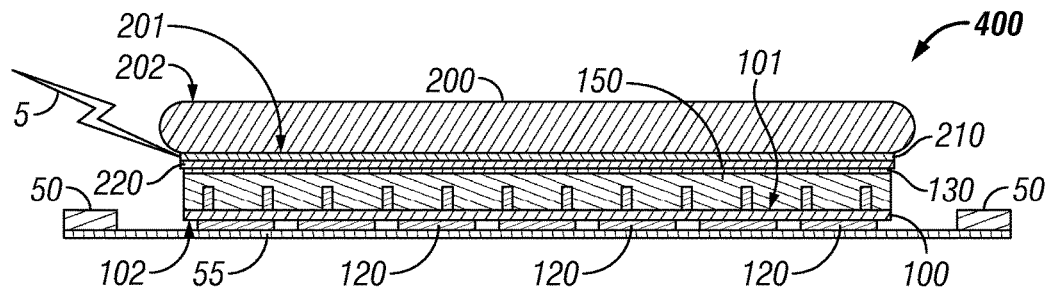
FIG. 13 is a schematic of an energy pulse applied to a foil layer of an embodiment of a semiconductor device assembly.
Figure 14:
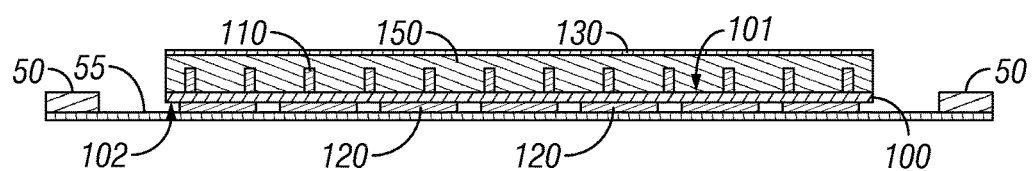
FIG. 14 is a schematic of an embodiment of a semiconductor device separated from a substrate.

As shown in FIG. 13, an energy pulse 5, such as a heat pulse, is applied to the foil layer 210 of the semiconductor device assembly 400. The energy 5 causes an exothermic reaction generating heat adequate to break down, or decompose, the release layer 220 without damaging the semiconductor device 100. The breaking down of the release layer 220 permits the substrate 200 to be removed off the metal layer 130 and layer of adhesive 150, as shown in FIG. 14. The metal layer 130 and layer of adhesive 150 may then be removed from the first surface 101 of the semiconductor device 100 by various mechanisms as would be appreciated by one of ordinary skill in the art.

Figure 15:
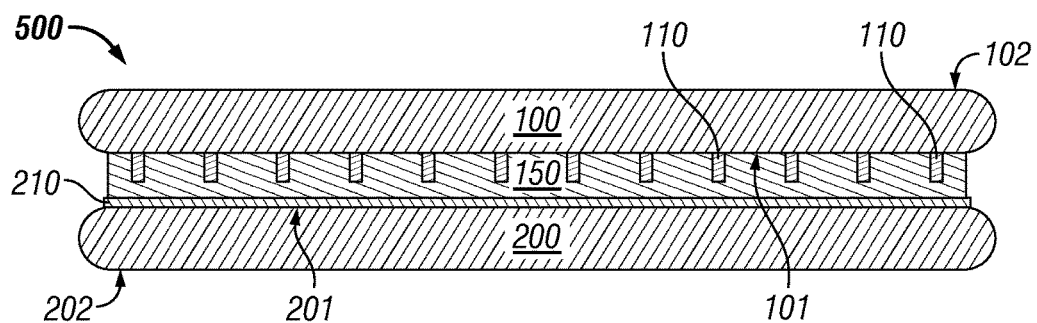
FIG. 15 is a schematic of an embodiment of a semiconductor device assembly.

FIG. 15 is a schematic of an embodiment of a semiconductor device assembly 500. The semiconductor device assembly 500 includes a semiconductor device 100 and a substrate 200. A foil layer 210 is deposited on a first, or top, surface 201 of the substrate 200. As discussed herein, the substrate 200 is a carrier that enables processing on the bottom or backside of the semiconductor device 100, as discussed herein. The semiconductor device assembly 500 does not includes a release layer between the layer of adhesive 150 and the foil layer 210. Instead, the foil layer 210 is connected directly to the layer of adhesive 150 on the semiconductor device 100. In some embodiments, a release layer may be positioned between the foil layer 210 and the layer of adhesive 150 so that substrate 200 may be selectively connected to the semiconductor device 100 depending on the materials comprising the foil layer 210 and/or the layer of adhesive 150 as would be appreciated by one of ordinary skill in the art having the benefit of this disclosure. As discussed herein, an energy pulse, such as a heat pulse, is applied to the foil layer 210 to cause an exothermic reaction. The foil layer 210 is consumed during the exothermic reaction releasing the substrate 200 from the semiconductor device 100 of the semiconductor device assembly 500.

Figure 16:
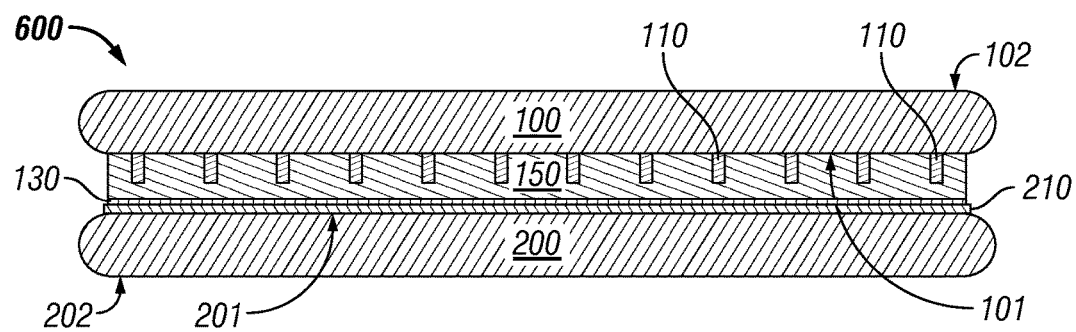
FIG. 16 is a schematic of an embodiment of a semiconductor device assembly.

FIG. 16 is a schematic of an embodiment of a semiconductor device assembly 600. The semiconductor device assembly 600 includes a semiconductor device 100 and a substrate 200. A foil layer 210 is deposited on a first, or top, surface 201 of the substrate 200. As discussed herein, the substrate 200 is a carrier that enables processing on the bottom or backside of the semiconductor device 100, as discussed herein. The semiconductor device assembly 600 does not includes a release layer between the layer of adhesive 150 and the foil layer 210. The semiconductor device assembly 600 includes a metal layer 130 deposited on the layer of adhesive 150, which may protect the semiconductor device 100 from potentially being damaged during the exothermic reaction of the foil layer 210. As discussed herein, an energy pulse, such as a heat pulse, is applied to the foil layer 210 to cause an exothermic reaction. The foil layer 210 is consumed during the exothermic reaction releasing the substrate 200 from the semiconductor device 100 of the semiconductor device assembly 600.

Figure 17:
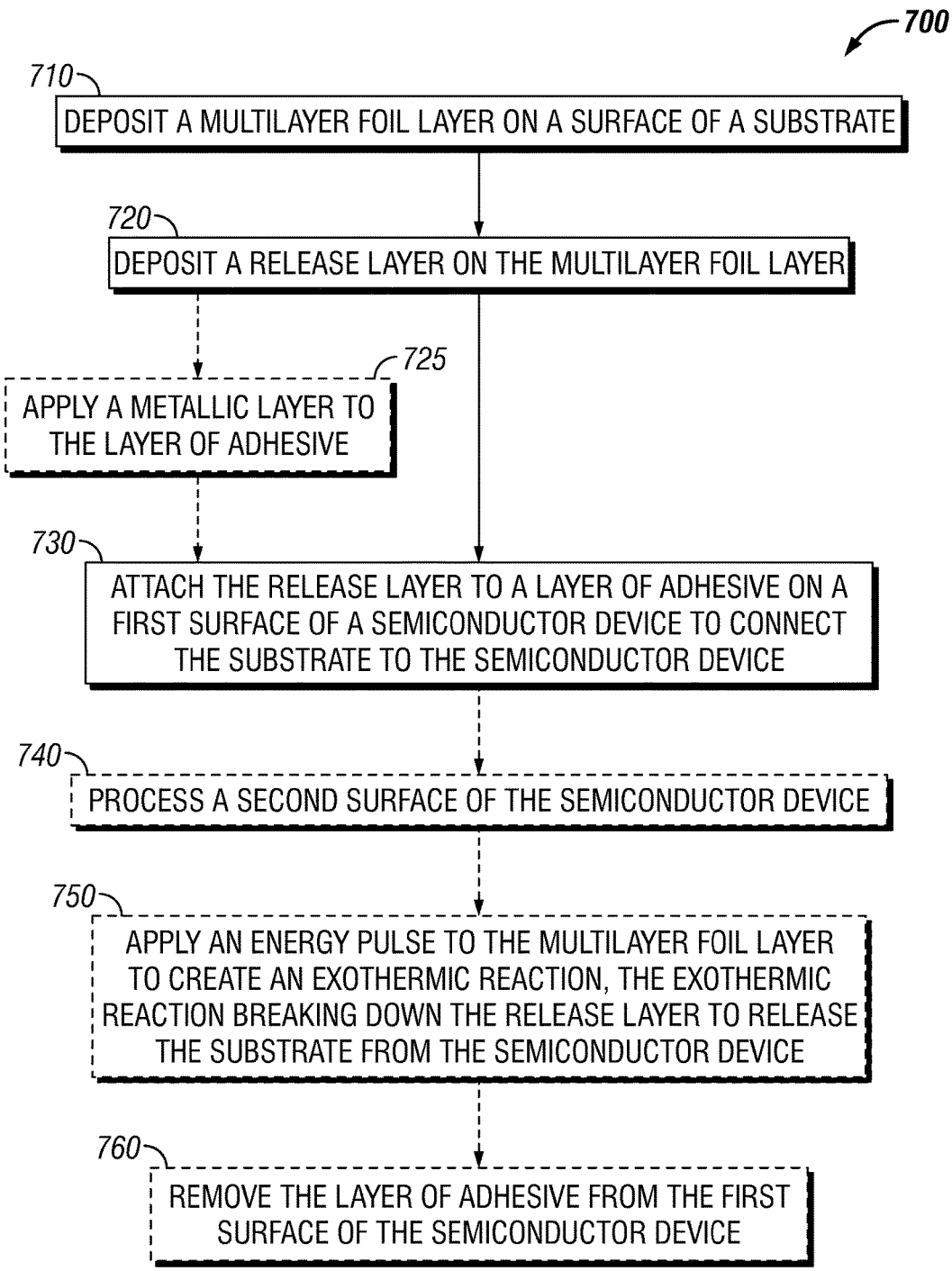
FIG. 17 is a flow chart of an embodiment of a method of making a semiconductor device assembly.

FIG. 17 is a flow chart for a method 700 of making a semiconductor device assembly. The method 700 includes depositing a multilayer foil layer on a surface of a substrate, at 710. Various mechanisms may be used to deposit the multilayer foil layer onto the surface of the substrate. For example, the multiplayer foil layer may be sputtered onto the substrate during a physical vapor deposition process as would be appreciated by one of ordinary skill in the art having the benefit of this disclosure. The method 700 includes depositing a release layer on the multilayer foil layer, at 720. At 730, the method 700 includes attaching the release layer to a layer of adhesive on a first surface of a semiconductor device to connect the substrate to the semiconductor device.

Prior to attaching the release layer to the layer of adhesive, the method 700 may include applying a metallic layer to the layer of adhesive, at 725. The metallic layer may protect the semiconductor device from potentially being damaged by heat generated by the multilayer foil layer, as discussed herein. The method 700 may include processing a second surface of the semiconductor device, at 740. For example, material may be removed from the second surface of the semiconductor device to reduce the width of the semiconductor device as would be appreciated by one of ordinary skill in the art. The method 700 may include applying an energy pulse to the multilayer foil layer to create an exothermic reaction, at 750. The exothermic reaction generates heat that breaks down the release layer to selectively release the substrate from the semiconductor device. Various mechanisms may be used to apply energy to the multilayer foil layer to cause the exothermic reaction as would be appreciated by one of ordinary skill in the art having the benefit of this disclosure. For example, a spark, electrical charge, heat pulse, or laser may be applied to the multilayer foil layer to cause the exothermic reaction within the multilayer foil layer. The method 700 may include removing the layer of adhesive form the first surface of the semiconductor device, at 760.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device assembly comprising:
   a semiconductor device having a first side and a second side;
   a substrate;
   a foil layer attached to a surface of the substrate;
   a release layer attached to the foil layer, the foil layer positioned between the release layer and the surface of the substrate; and
   a layer of adhesive configured to connect the semiconductor device to the substrate, the layer of adhesive positioned between the first side of the semiconductor device and the release layer, wherein upon the application of an energy pulse to the foil layer, the foil layer is configured to generate heat to cause the release layer to selectively release the substrate from the adhesive layer, wherein the foil layer is a multilayer foil comprised of alternating layers of two materials.

2. The assembly of claim 1, wherein the heat generated from the foil layer breaks down the release layer.

3. The assembly of claim 2, wherein the energy pulse causes an exothermic reaction in the foil layer.

4. The assembly of claim 1, wherein the two materials are one of nickel and aluminum, zirconium and aluminum, nickel and silicon, molybdenum and silicon, palladium and aluminum, or rhodium and aluminum.

5. The assembly of claim 1, wherein the foil layer is configured to generate heat of 1000 degrees Celsius or greater.

6. The assembly of claim 1, wherein the foil layer is configured to generate heat that exceeds a decomposition temperature of the release layer.

7. The assembly of claim 1, comprising a metal layer positioned between the release layer and the layer of adhesive.

8. The assembly of claim 1, wherein the semiconductor device includes a plurality of structures on the first side, the plurality of structures being pads, pillars, vias, or a combination thereof.

9. The assembly of claim 1, wherein the release layers is one of silicone, epoxy, polyimide, carbonate, or a combination thereof.

10. A semiconductor device assembly comprising
   a semiconductor device having a first side and a second side;
   a substrate;
   a multilayer foil layer attached to a surface of the substrate;
   a layer of adhesive connects the semiconductor device to the substrate, the layer of adhesive positioned between the first side of the semiconductor device and the multilayer foil layer, wherein upon the application of an energy pulse to the multilayer foil layer is configured to have an exothermic reaction that releases the substrate from the semiconductor device; and
   a layer of metal between the multilayer foil layer and the layer of adhesive.

11. The assembly of claim 10, wherein the energy pulse is an electrical charge.

12. A method of making a semiconductor device assembly comprising
   depositing a multilayer foil layer on a surface of a substrate;
   depositing a release layer on the multilayer foil layer, wherein the multilayer foil layer is positioned between the release layer and the surface of the substrate;
   attaching the release layer to a layer of adhesive on a first surface of a semiconductor device to connect the substrate to the semiconductor device;
   processing a second surface of the semiconductor device, the second surface being opposite the first surface; and
   applying a metallic layer to the layer of adhesive prior to attaching the release layer to the layer of adhesive on the first surface of a semiconductor device.

13. The method of claim 12, applying an energy pulse to the multilayer foil layer to create an exothermic reaction, the exothermic reaction breaking down the release layer releasing the substrate from the semiconductor device.

14. The method of claim 13, wherein applying the energy pulse to the multilayer foil comprises applying an electric charge to the multilayer foil layer.

15. The method of claim 13, wherein applying the energy pulse to the multilayer foil comprises applying a laser pulse to the multilayer foil layer.

16. The method of claim 13, comprising removing the layer of adhesive from the first surface of the semiconductor device.

17. The method of claim 12, wherein processing comprises removing material from the second surface of the semiconductor device.

\* \* \* \* \*